US008559251B2

(12) United States Patent
Lin et al.

(10) Patent No.: US 8,559,251 B2
(45) Date of Patent: Oct. 15, 2013

(54) MEMORY CIRCUIT AND METHOD OF WRITING DATUM TO MEMORY CIRCUIT

(75) Inventors: Chih-Yu Lin, Taichung (TW); Wei Min Chan, Sindian (TW); Yen-Huei Chen, Jhudong Township (TW); Hung-Jen Liao, Hsinchu (TW); Jonathan Tsung-Yung Chang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 86 days.

(21) Appl. No.: 13/354,884

(22) Filed: Jan. 20, 2012

(65) Prior Publication Data
US 2013/0188433 A1 Jul. 25, 2013

(51) Int. Cl.
*G11C 7/10* (2006.01)
(52) U.S. Cl.
USPC ............. 365/189.16; 365/154; 365/189.05; 365/190
(58) Field of Classification Search
USPC .......................................... 365/156
See application file for complete search history.

(56) References Cited

U.S. PATENT DOCUMENTS

| 7,420,834 B2* | 9/2008 | Maeda et al. ............... 365/154 |
| 7,800,959 B2* | 9/2010 | Childs et al. ............. 365/189.08 |
| 2010/0259973 A1* | 10/2010 | Houston ..................... 365/154 |
| 2011/0007557 A1* | 1/2011 | Niki et al. ................... 365/154 |

OTHER PUBLICATIONS

Pilo, Harold, et al., "A 64Mb SRAM in 32nm High-K Metal-Gate SOI Technology with 0.7v Operation Enabled by Stability, Write-Ability and Read-Ability Enhancements", IEEE International Solid-State Circuits Conference 2011, pp. 254-256.

* cited by examiner

*Primary Examiner* — Tan T. Nguyen
(74) *Attorney, Agent, or Firm* — Lowe Hauptman & Ham, LLP

(57) ABSTRACT

A circuit includes a first node, a second node, a memory cell, a first data line, a second data line, and a write driver. The memory cell is coupled to the first node and the second node and powered by a first voltage at the first node and a second voltage at the second node. The first data line and the second data line are coupled to the memory cell. The write driver has a third node carrying a third voltage less than the first voltage during a write operation. The write deriver is coupled to the first data line and the second data line and configured to, during a write operation, selectively coupling one of the first data line and the second data line to the third node and coupling the other one of the first data line and the second data line to the first node.

20 Claims, 6 Drawing Sheets

MEMORY CIRCUIT AND METHOD OF WRITING DATUM TO MEMORY CIRCUIT

BACKGROUND

A Static Random Access Memory (SRAM) is a type of semiconductor memory that uses bi-stable latching circuitry to store data. SRAM is usable to retain data, but remains volatile in the conventional sense that data is eventually lost when the memory is not powered. A SRAM circuit includes a plurality of SRAM memory cells. There are several types of SRAM memory cells, e.g., 6-transistor (6T) SRAM, dual-port 8-transistor (8T) SRAM, etc. Usually, at least two of the transistors in an SRAM memory cell are used as switches to selectively couple the bi-stable latching circuitry of the SRAM memory cell with two data lines, also known as "bit line" and "bit line bar" or "bit line" and "complementary bit line." When an SRAM circuit is designed to operate at a low power supply voltage, the write margin and operable speed of the SRAM memory cell is limited by many factors, including the coupling efficiency of the switches between the data lines and the bi-stable latching circuitry.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1:
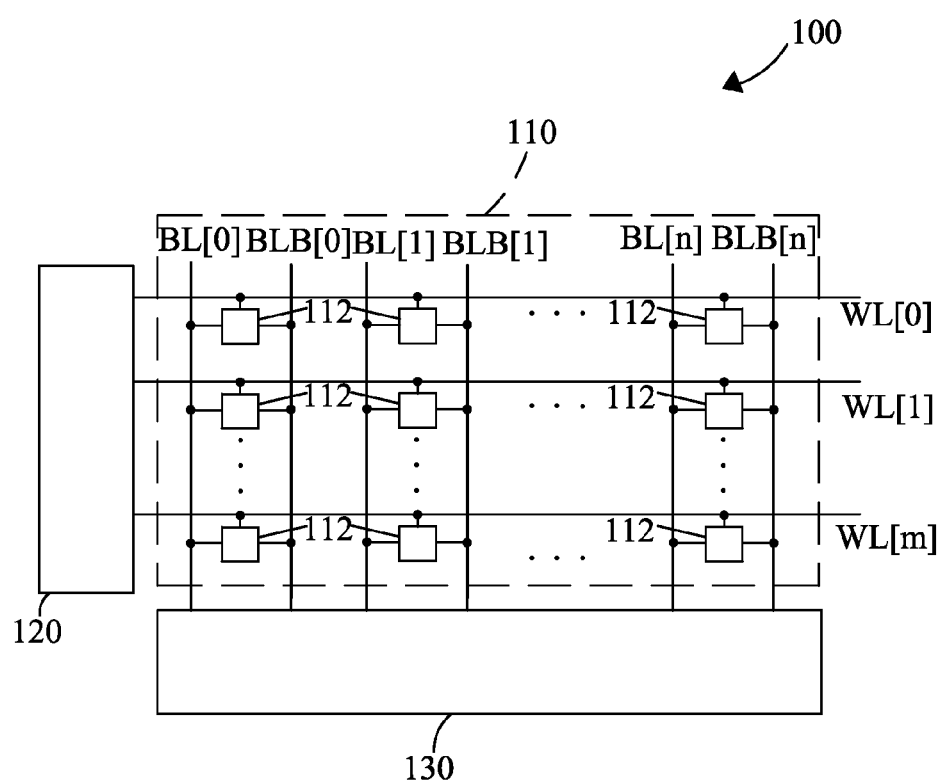
FIG. 1 is a schematic diagram of an SRAM circuit in accordance with one or more embodiments.

It is understood that the following disclosure provides many different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

The formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an SRAM circuit 100 in accordance with one or more embodiments. The SRAM circuit 100 depicted in FIG. 1 has been simplified in furtherance of the understanding of the present disclosure. A person of ordinary skill in the art would appreciate that, in some embodiments, varied or additional electrical components may be implemented in conjunction with the SRAM circuit 100 as depicted in FIG. 1.

The SRAM circuit 100 includes an SRAM memory cell array 110, a row decoder 120 coupled to the SRAM memory cell array 110 through a plurality of word lines WL[0:m], and a column driving circuit 130 coupled to the SRAM memory cell array 110 through a plurality of data lines, including bit lines BL[0:n] and corresponding complementary bit lines (also known as bit line bar) BLB[0:n], where "m" and "n" are positive integers.

The SRAM memory cell array 110 has a plurality of memory cells 112 usable for storing data. Each memory cell 112 is coupled to one of the word lines WL[0:m], one of the bit lines BL[0:n], and the corresponding one of the complementary bit lines BLB[0:n]. In some embodiments, the row decoder 120 and the column driving circuit 130 each receives an address of the memory cell 112 to be accessed. The row decoder 120 activates one of the word lines WL[0:m] according to the received address, and the column driving circuit 130 identifies a pair of bit line and complementary bit line, said BL[0] and BLB[0] for example, based on the received address and reads or writes a datum using the identified pair of bit line BL[0] and complementary bit line BLB[0].

Figure 2A:
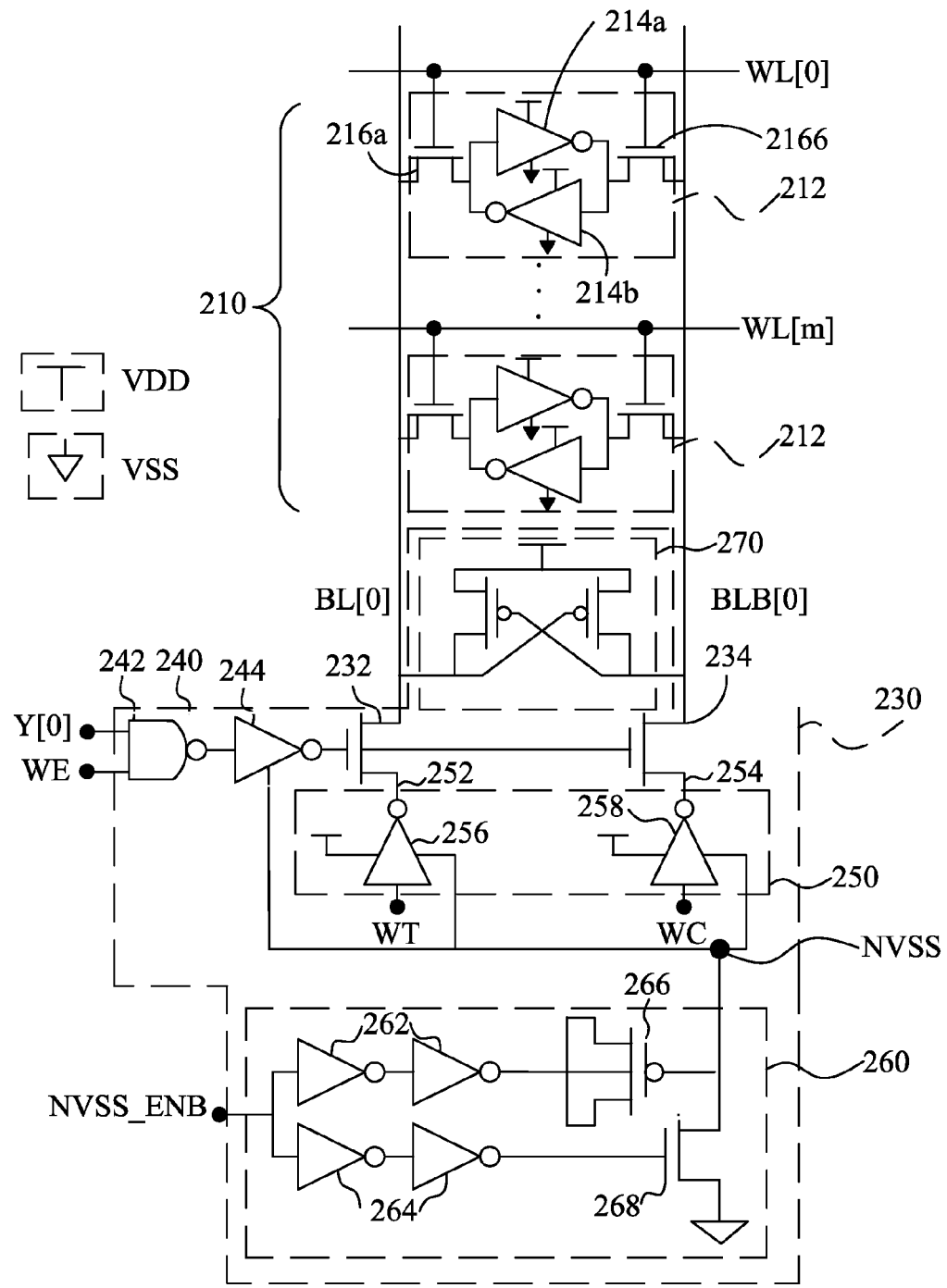
FIGS. 2A and 2B are schematic diagrams of a column of memory cells and a write driver of an SRAM circuit in accordance with one or more embodiments.

FIG. 2A is a schematic diagram of a column of memory cells 210 and a write driver 230 of an SRAM circuit (such as the SRAM circuit 100 of FIG. 1) in accordance with one or more embodiments. The column of memory cells 210 includes m memory cells 212 each coupled with a word line WL [0:m]. The write driver 230 coupled with the column of m memory cells 212 through two data lines, including the bit line BL[0] and the complementary bit line BLB[0]. In at least one embodiment, the write driver 230 is usable as a portion of the column driving circuit 130 depicted in FIG. 1. The write driver 230 receives a column selection signal Y[0], which is a signal obtained by decoding the address of the to-be-accessed memory cell. The write driver 230 also receives an external write enable signal WE and a negative biasing control signal NVSS_ENB from one or more circuit blocks outside of the write driver 230.

Each memory cell 212 includes cross-coupled inverters 214a and 214b and switches 216a and 216b. The switches 216a and 216b are coupled between outputs of the inverters 214a and 214b and the data lines BL[0] and BLB[0], respectively. Each word line WL[0] or WL[m], for example, coupled to the corresponding switches 216a and 216b and are usable of selectively coupling the cross-coupled inverters 214a and 214b with the data lines BL[0] and BLB[0]. The memory cell 212 is coupled to a first node VDD and a second node VSS. The first node VDD carries a first voltage, and the second node VSS carries a second voltage less than the first voltage of the first node VDD. The memory cell 212 is powered by the first voltage and the second voltage. In some embodiments, the second voltage represents a ground of the SRAM circuit, and the first voltage ranges from about 0.7 to 5.0 volts greater than the ground.

The write driver 230 includes a first switch 232, a second switch 234, a write control driver 240, a write signal driver 250, a power circuit 260, and a pull-up circuit 270. The power circuit 260 receives the negative biasing control signal NVSS_ENB and generates a third voltage at node NVSS in response to the negative biasing control signal NVSS_ENB during a write operation. In at least one embodiment, the third voltage is less than the first voltage. The first switch 232 is coupled between the data line BL[0] and the write signal driver 250 and controlled by the write control driver 240. The second switch 234 is coupled between the data line BLB[0] and the write signal driver 250 and controlled by the write control driver 240 as well.

The write control driver 240 generates a write control signal in response to the external write enable signal WE and the column selection signal Y[0] in order to selectively turn on or off the switches 232 and 234. The first switch 232 and the second switch 234 thus couple the data line BL[0] with the write data line 232 and the data line BLB[0] with the complementary write data line 234 in response to the write control signal. The pull-up circuit 270 is coupled to the data line BL[0] and data line BLB[0] and couples one of the data line BL[0] and data line BLB[0] with the first node VDD. In some embodiments, the pull-up circuit 270 is omitted.

The write signal driver 250 has a write data input terminal WT, a complementary write data input terminal WC, a write data line 252, a complementary write data line 254, a first inverter 256 coupled between the write data line 252 and the write data input terminal WT, and a second inverter 258 coupled between the complementary write data line 254 and the complementary write data input terminal WC. The first inverter 256 and the second inverter 258 are powered by the first voltage at node VDD and a voltage at node NVSS. Therefore, the write driver 230, during the write operation, selectively couples one of the data line BL[0] and the data line BLB[0] to the third node NVSS and couples the other one of the data line BL[0] and the data line BLB[0] to the first node VDD. Therefore, during the write operation, the write signal driver 250 selectively charges or discharges, in response to signals at the write data input terminal WT and the complementary write data input terminal WC, one of the data line BL[0] and data line BLB[0] toward the third voltage at node NVSS and the other one of the data line BL[0] and data line BLB[0] toward the first voltage at node VDD.

In some embodiments, the first switch 232 is an N-type Metal-Oxide Semiconductor Field Effect Transistor ("NMOS transistor"), and the second switch 234 is also an NMOS transistor. In some embodiments, the first switch 232 has a source terminal, a drain terminal, and a gate terminal. The drain terminal of the first switch 232 is coupled to the data line BL[0], the source terminal of the first switch 232 is coupled to the write data line 252, and the gate terminal of the first switch 232 is coupled to the write control driver 240 and supplied with the write control signal. In some embodiments, the second switch 234 has a source terminal, a drain terminal, and a gate terminal. The drain terminal of the second switch 234 is coupled to the data line BLB[0], the source terminal of the second switch 234 is coupled to the complementary write data line 254, and the gate terminal of the second switch 234 is coupled to the write control driver 240 as well and supplied with the write control signal.

The write control driver 240 includes a logic gate 242 and a driving gate 244. The logic gate receives the column selection signal Y[0] and the external write enable signal WE and transmits an output signal to the driving gate 244. The driving gate 244 is powered by the voltages at the first node VDD and the third node NVSS and outputs the write control signal either at the first voltage or the third voltage. In some embodiments, the functionality of the logic gate 242 and the driving gate 244 are consolidated in a single logic component, and thus one of the logic gate 242 or the driving gate 244 is omitted.

The power circuit 260 has serially connected inverters 262, serially connected inverters 264, a capacitor 266, and a NMOS transistor 268. The capacitor 266 is coupled between the inverters 262 and the node NVSS. The NMOS transistor 268 is coupled between the node NVSS and the node VSS and controlled by the signal output from the inverters 264. Prior to activation of the negative biasing control signal NVSS_ENB, the NMOS transistor 268 is turned on, and the capacitor 266 is charged to have more negative carriers at node NVSS or more positive carriers at the terminal coupled with the inverters 262. In some embodiments, the activation of the negative biasing control signal NVSS_ENB refers to switching the signal NVSS_ENB from a logic High level represented by the first voltage at node VDD to a logic Low level represented by the second voltage at node VSS. When the negative biasing control signal NVSS_ENB is activated, the NMOS transistor 268 is turned off, the inverters 262 output the second voltage, and the voltage level at the node NVSS is pushed to the third voltage less than the second voltage by the capacitor 266.

In some embodiments, the second voltage defines the ground of the SRAM circuit, and the third voltage ranges from about 100 mV to 300 mV less than the ground. In at least one embodiment, the power circuit 260 is omitted, and the node NVSS is coupled to the node VSS, and thus the third voltage equals the second voltage.

In at least one embodiment, the data line BL[0] and data line BLB[0] are charged or discharged toward predetermined voltage levels. Compared with a configuration coupling a write data signal to only one of the data line BL[0] and BLB[0] and leaving the other one floating or solely to the pull-up circuit 270, an SRAM circuit based on the embodiment of FIG. 2A has an improved write margin and thus has a lower minimum operation voltage (sometimes being referred to as "VCCmin").

Figure 2B:
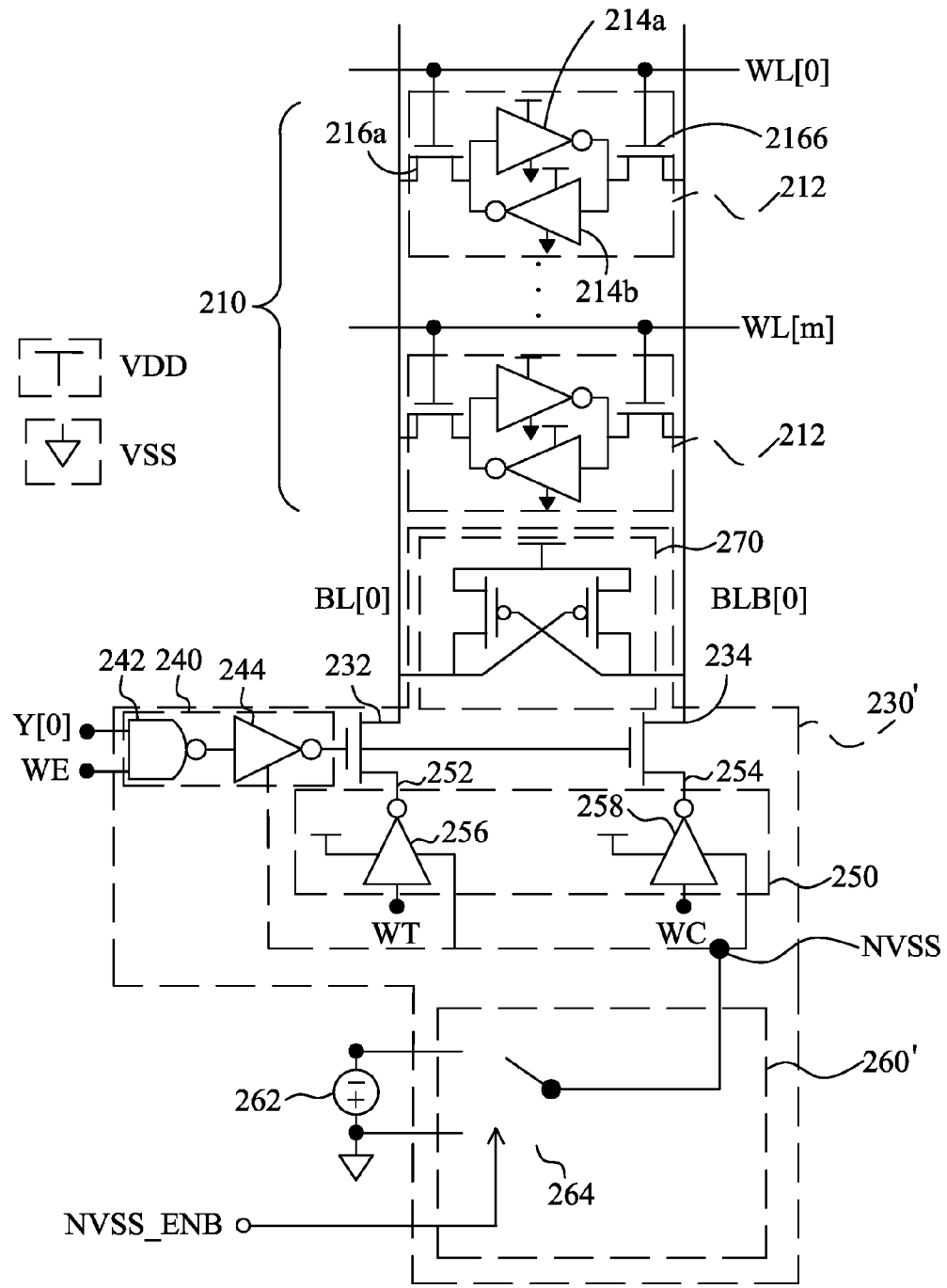

FIG. 2B is a schematic diagram of a column of memory cells 210 and a write driver 230' of an SRAM circuit (such as the SRAM circuit 100 of FIG. 1) in accordance with one or more embodiments. FIG. 2B depicts an embodiment where, compared with the embodiment depicted in FIG. 2A, the power circuit 260' in the write driver 230' is not capable of generating the third voltage. Instead, the power circuit 260' is coupled to the node VSS and an external power source 262 providing the third voltage at node Vo. The power circuit 260' has a switch 262 that selectively couples the node NVSS with the node VSS or the node Vo in response to the negative biasing control signal NVSS_ENB. As mentioned above, in some embodiments, the power circuit 260' (or the power circuit 260 in FIG. 2A) is omitted, and the node NVSS is coupled to the node VSS.

Figure 3A:
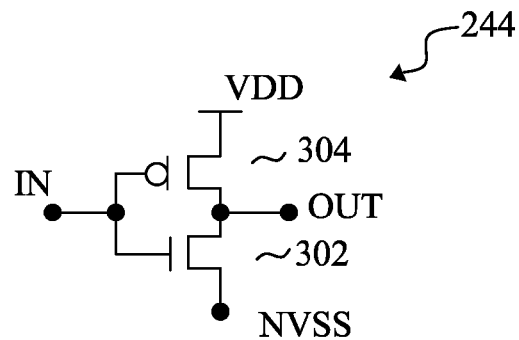
FIGS. 3A-3C are schematic diagrams of example driving gates of a write control driver in accordance with one or more embodiments.

FIG. 3A is a schematic diagram of an example driving gate 244 of a write control driver (such as write control driver 240 in FIG. 2A) in accordance with one or more embodiments. The driving gate 244 has an inverter including a NMOS transistor 302 and a P-type Metal-Oxide Semiconductor Field Effect Transistor (PMOS transistor) 304. The source terminal of the PMOS transistor is coupled to node VDD, the drain terminals of the PMOS transistor 304 and the NMOS transistor 302 are coupled to an output terminal OUT of the driving gate 244. The source terminal of the NMOS transistor 302 is coupled to the node NVSS. The gates of the PMOS transistor 304 and the NMOS transistor 302 are coupled to an input terminal IN of the driving gate 244.

Figure 3B:
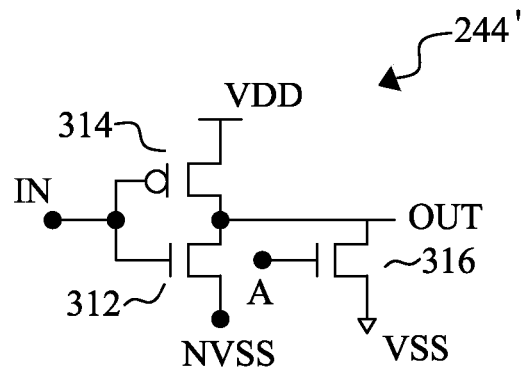

FIG. 3B is a schematic diagram of another example driving gate 244' of a write control driver 240 in accordance with one or more embodiments. The driving gate 244' has an inverter including a NMOS transistor 312 and a PMOS transistor 314 connected as an inverter powered by the voltages at node VDD and node NVSS. In addition, the driving gate 244' further has another NMOS transistor 316, where the source terminal of the NMOS transistor 316 is coupled to the node VSS, the drain terminal of the NMOS transistor 316 is coupled to the node OUT, and the gate terminal of the NMOS transistor 316 is coupled to a node A for receiving an additional control signal. This configuration allows more flexibility in controlling the generation of the write control signal.

Figure 3C:
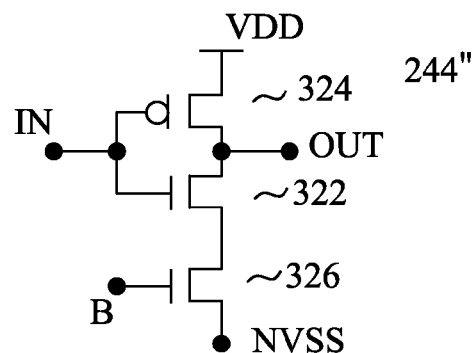

FIG. 3C is a schematic diagram of yet another example driving gate 244" of a write control driver 240 in accordance with one or more embodiments. The driving gate 244" has a NMOS transistor 322 and a PMOS transistor 324 connected in an inverter-like manner. In addition, the driving gate 244" further has another NMOS transistor 326, where the source terminal of the NMOS transistor 326 is coupled to the node NVSS, the drain terminal of the NMOS transistor 316 is coupled to the source terminal of the NMOS transistor 322, and the gate terminal of the NMOS transistor 316 is coupled to a node B for receiving an additional control signal. This configuration allows more flexibility in controlling the generation of the write control signal.

Figure 4A:
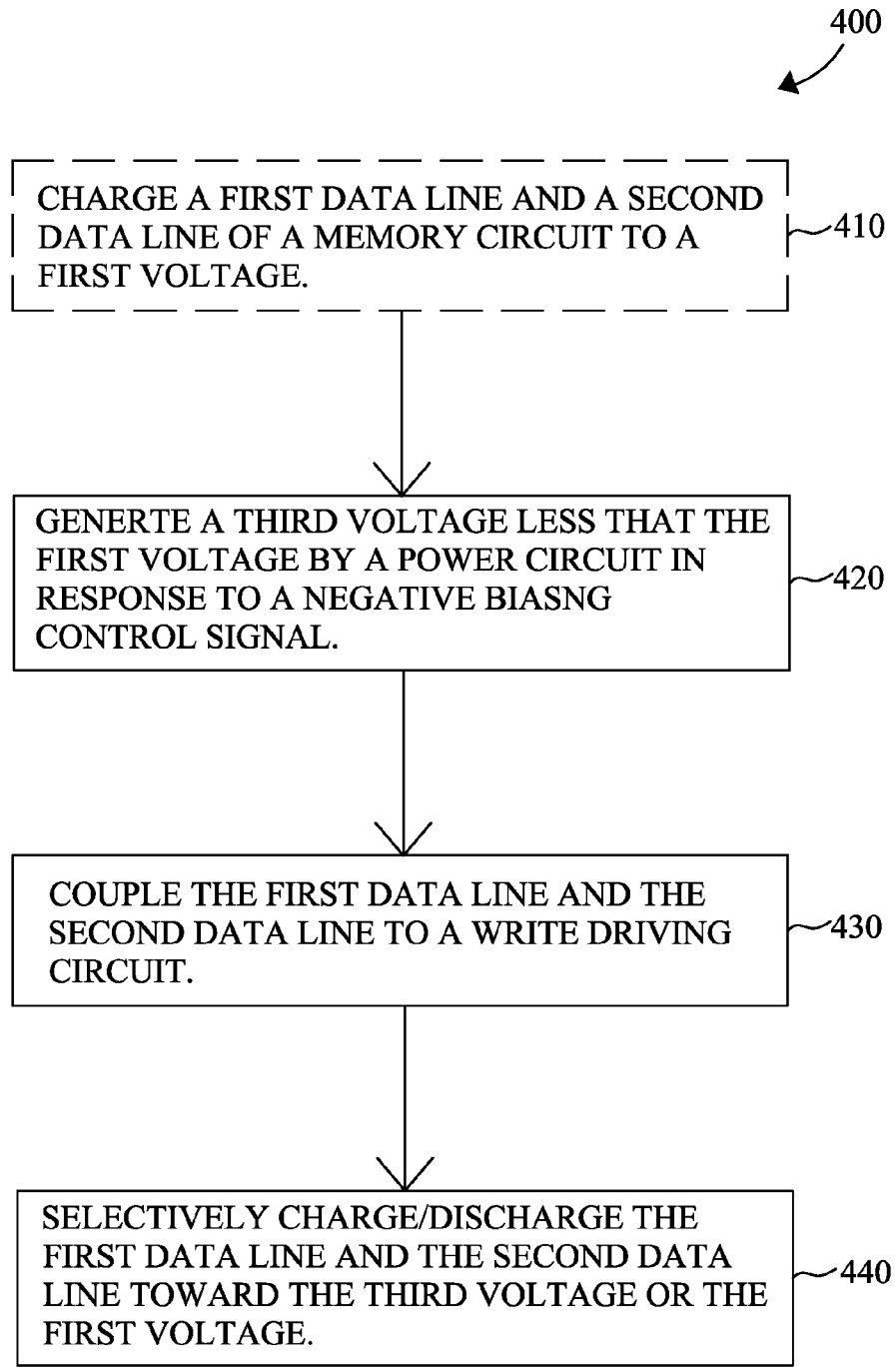
FIGS. 4A and 4B are flow charts of a method of writing a datum into a memory cell in accordance with one or more embodiments.
Figure 4B:
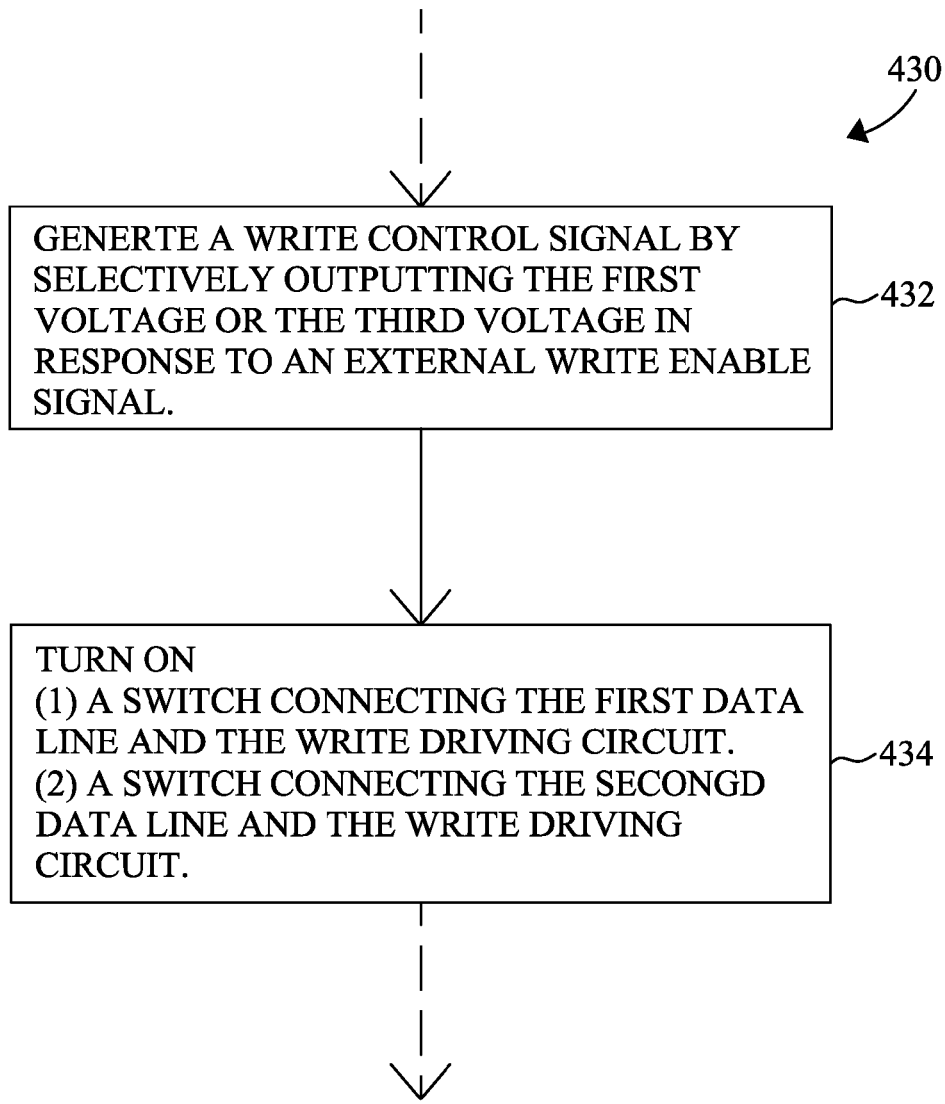

FIGS. 4A and 4B are flow charts of a method of writing a datum into a memory cell in accordance with one or more embodiments. It is understood that additional processes may be performed before, during, and/or after the method 400 depicted in FIGS. 4A and 4B, and that some other processes may only be briefly described herein.

The embodiment depicted in FIG. 2A is also used in furtherance of the description of the method 400 of writing a datum into a memory cell 212 of a memory circuit in response to a signal at a write data input terminal WT of the memory circuit and a signal at a complementary write data input terminal WC of the memory circuit. The memory cell 212 is coupled to a node VDD and a node VSS and powered by a first voltage at node VDD and a second voltage at node VSS. The second voltage is less than the first voltage. In addition, data lines BL[0] and BLB[0] are coupled to the memory cell 212.

In operation 410, the data line BL[0] and data line BLB[0] are charged to a first voltage, such as the voltage level at node VDD. Operation 410 is also known as a pre-charge operation or a pre-write operation. In some embodiments, because the data line BL[0] and data line BLB[0] will be charged or discharged toward two predetermined voltage levels, and thus operation 410 is omitted.

In operation 420, a third voltage is generated at node NVSS by a power circuit 260 in response to a negative biasing control signal NVSS_ENB. In some embodiments, the third voltage is less than the second voltage. In some embodiments, the second voltage defines a ground, and the third voltage ranges from about 100 mV to 300 mV less than the ground. In at least one embodiment, the power circuit 260 is omitted, and the node NVSS is coupled to the node VSS, and thus the third voltage equals the second voltage.

In operation 430, the data line BL[0] and the data line BLB[0] are coupled to a write driving circuit 250 in response to an external write enable signal WE. As depicted in FIG. 4B, operation 430 includes, in operation 432, generating, by a write control driver 240, the write control signal by selectively outputting the first voltage or the third voltage in response to the external write enable signal WE. Then, in operation 434, the data line BL[0] and the data line BLB[0] are coupled with the write driving circuit 250, in response to the write control signal, by turning on a first switch 232 connecting the data line BL[0] and the write driving circuit 250 and a second switch 234 connecting the data line BLB[0] and the write driving circuit 250. In at least one embodiment, the first switch 232 and the second switch 234 are simultaneously turned on or off by the write control signal.

The process moves on to operation 440 (FIG. 4A), where the write driving circuit 250 selectively charges or discharges one of the data lines BL[0] and BLB[0] toward the third voltage at node NVSS and the other one of the data lines BL[0] and BLB[0] toward the first voltage at node VDD in response to signals at the write data input terminal WT and the complementary write data input terminal WC.

In accordance with some embodiments, a circuit includes a first node configured to carry a first voltage, a second node configured to carry a second voltage less than the first voltage, a memory cell, a first data line, a second data line, and a write driver. The memory cell is coupled to the first node and the second node and powered by the first voltage and the second voltage. The first data line and the second data line are coupled to the memory cell. The write driver has a third node configured to carry a third voltage less than the first voltage during a write operation. The write deriver is coupled to the first data line and the second data line and configured to, during a write operation, selectively coupling one of the first data line and the second data line to the third node and coupling the other one of the first data line and the second data line to the first node.

In accordance with some embodiments, a circuit includes a first node configured to carry a first voltage, a second node configured to carry a second voltage less than the first voltage, a memory cell, a first data line, a second data line, a write data line, a complementary write data line, a first N-type transistor, a second N-type transistor, and a write signal driver. The memory cell is coupled to the first power node and the second power node and powered by the first voltage and the second voltage. The first data line and the second data line are coupled to the memory cell. A drain terminal of the first N-type transistor is coupled to the first data line, and a source terminal of the first N-type transistor coupled to the write data line. A drain terminal of the second N-type transistor is coupled to the second data line, and the source terminal of the first N-type transistor coupled to the complementary write data line. The write signal driver is coupled to a write data input terminal, a complementary write data input terminal, the write data line, and the complementary write data line. The first N-type transistor, the second N-type transistor, and the write signal driver are configured to selectively charge or discharge, in response to signals at the write data input terminal and the complementary write data input terminal, one of the first and second data lines toward a third voltage and the other one of the first and second data lines toward the first voltage. The third voltage is less than the first voltage.

In accordance with some embodiments, a method of writing a datum into a memory cell of a memory circuit includes coupling a first data line and a second data line of the memory circuit to a write driving circuit of the memory circuit in response to an external write enable signal. The first data line and the second data are coupled to the memory cell. the write driving circuit selectively charges or discharges one of the first data line and the second data line toward a third voltage less than the first voltage and the other one of the first data line and the second data line toward the first voltage in response to signals at the write data input terminal and the complementary write data input terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
    a first node configured to carry a first voltage;
    a second node configured to carry a second voltage less than the first voltage;
    a memory cell coupled to the first node and the second node and powered by the first voltage and the second voltage;
    a first data line and a second data line coupled to the memory cell; and
    a write driver having a third node configured to carry a third voltage less than the first voltage during a write operation, the write driver coupled to the first data line and the second data line and configured to, during a write operation, selectively coupling one of the first data line and the second data line to the third node and coupling the other one of the first data line and the second data line to the first node.

2. The circuit of claim 1, wherein the write driver comprises:
    a first switch configured to selectively couple the first data line with a write data line in response to a write control signal; and
    a second switch configured to selectively couple the second data line with a complementary write data line in response to the write control signal.

3. The circuit of claim 2,
    wherein the first switch comprises a first source/drain terminal, a second source/drain terminal, and a gate terminal, the first source/drain terminal of the first switch coupled to the first data line, the second source/drain terminal of the first switch coupled to the write data line, and the gate terminal of the first switch configured to receive the write control signal; and
    wherein the second switch comprises a first source/drain terminal, a second source/drain terminal, and a gate terminal, the first source/drain terminal of the second switch coupled to the second data line, the second source/drain terminal of the second switch coupled to the complementary write data line, and the gate terminal of the second switch configured to receive the write control signal.

4. The circuit of claim 2, wherein the write driver further comprises a write control driver configured to generate the write control signal in response to an external write enable signal, the write control driver configured to generate the write control signal by selectively outputting the first voltage or the third voltage.

5. The circuit of claim 4, wherein the write control driver has a driving gate comprising an N-type transistor having a source terminal coupled to the third node.

6. The circuit of claim 2, wherein the write driver further comprises:
    a first inverter coupled between the write data line and a write data input terminal;
    a second inverter coupled between the complementary write data line and a complementary write data input terminal;
    and the first inverter and the second inverter are configured to be powered by the first voltage and the third voltage.

7. The circuit of claim 6, wherein the write driver further comprises a power circuit configured to generate the third voltage in response to a negative biasing control signal.

8. The circuit of claim 1, wherein the second voltage and the third voltage equal a ground.

9. The circuit of claim 1, wherein the third voltage is less than the second voltage.

10. The circuit of claim 9, wherein the second voltage equals a ground, and the third voltage equals from about 100 mV to 300 mV less than the ground.

11. A circuit comprising:
    a first node configured to carry a first voltage;
    a second node configured to carry a second voltage less than the first voltage;
    a memory cell coupled to the first power node and the second power node and powered by the first voltage and the second voltage;
    a first data line and a second data line coupled to the memory cell;
    a write data line;
    a complementary write data line;
    a first N-type transistor having a source terminal, a drain terminal, and a gate terminal, the drain terminal of the first N-type transistor coupled to the first data line, the source terminal of the first N-type transistor coupled to the write data line;
    a second N-type transistor having a source terminal, a drain terminal, and a gate terminal, the drain terminal of the second N-type transistor coupled to the second data line, the source terminal of the first N-type transistor coupled to the complementary write data line; and
    a write signal driver coupled to a write data input terminal, a complementary write data input terminal, the write data line, and the complementary write data line,
    the first N-type transistor, the second N-type transistor, and the write signal driver being configured to selectively charge or discharge, in response to signals at the write data input terminal and the complementary write data input terminal, one of the first and second data lines toward a third voltage, less than the first voltage, and the other one of the first and second data lines toward the first voltage.

12. The circuit of claim 11, wherein the second voltage and the third voltage equal a ground.

13. The circuit of claim 11, wherein the third voltage is less than the second voltage.

14. The circuit of claim 13, wherein the second voltage equals a ground, and the third voltage equals from about 100 mV to 300 mV less than the ground.

15. The circuit of claim 13, wherein the circuit further comprises a write control driver configured to generate a write control signal in response to receipt of an external write enable signal, and to cause transmission of the write control signal to the gate of the first N-type transistor and the gate of the second N-type transistor.

16. The circuit of claim 15, wherein the write control driver comprises a third N-type transistor having a source terminal configured to receive the third voltage.

17. A method of writing a datum into a memory cell of a memory circuit, the memory cell being powered by the first voltage and a second voltage less than the first voltage, the method comprising:
    coupling a first data line and a second data line to a write driving circuit in response to an external write enable signal, the first data line and the second data coupled to the memory cell; and selectively charging or discharging, by the write driving circuit, one of the first data line and the second data line toward a third voltage less than the first voltage and the other one of the first data line and the second data line toward the first voltage in response to a signal at a write data input terminal of the memory circuit and a signal at a complementary write data input terminal of the memory circuit.

18. The method of claim 17, further comprising:
generating the third voltage by a power circuit in response to a negative biasing control signal, the third voltage being less than a ground.

19. The method of claim 17, wherein the coupling of the first data line and the second data line with the write driving circuit comprises simultaneously turning on a first switch connecting the first data line and the write driving circuit and a second switch connecting the second data line and the write driving circuit.

20. The method of claim 19, wherein the first and second switches are controlled by a write control signal, and the coupling of the first data line and the second data line with the write driving circuit further comprises:
generating, by a write control driver, the write control signal by selectively outputting the first voltage or the third voltage in response to the external write enable signal.

* * * * *